United States Patent
Faragi et al.

[11] Patent Number: 6,162,064
[45] Date of Patent: Dec. 19, 2000

[54] METHOD AND APPARATUS FOR ELASTOMER CONNECTION BETWEEN A BONDING SHELF AND A SUBSTRATE

[75] Inventors: Eric Joseph Faragi; Sameh A. Taha, both of Boynton Beach, Fla.

[73] Assignee: Motorola, Schaumburg, Ill.

[21] Appl. No.: 08/958,232

[22] Filed: Oct. 27, 1997

[51] Int. Cl.[7] .............................. H05K 1/00; H01R 4/58
[52] U.S. Cl. ................................................. 439/66; 439/91
[58] Field of Search ........................... 439/66, 91, 67, 439/951; 359/82; 349/159

[56] References Cited

U.S. PATENT DOCUMENTS

| | | | |
|---|---|---|---|
| 3,998,512 | 12/1976 | Anhalt et al. | 339/17 CF |
| 4,012,117 | 3/1977 | Lazzery | 350/160 |
| 5,160,268 | 11/1992 | Hakamian | 439/66 |
| 5,436,744 | 7/1995 | Arledge et al. | 359/82 |
| 5,586,890 | 12/1996 | Braun | 439/66 |
| 5,636,996 | 6/1997 | Johnson et al. | 439/66 |
| 5,705,855 | 1/1998 | Carson et al. | 257/737 |
| 5,733,640 | 3/1998 | Horiuchi et al. | 428/210 |
| 5,785,538 | 7/1998 | Beaman et al. | 439/91 |
| 5,805,424 | 9/1998 | Purinton | 361/760 |
| 5,810,607 | 9/1998 | Shih et al. | 439/66 |
| 5,888,429 | 3/1999 | Lovell | 252/502 |
| 6,019,609 | 2/2000 | Strange | 439/66 |

*Primary Examiner*—Brian Sircus
*Assistant Examiner*—Chandrika Prasad
*Attorney, Agent, or Firm*—Pablo Meles

[57] ABSTRACT

An elastomer connection between a bonding shelf (20) and a substrate (28) includes a plurality of conductive runners (23) on a surface of the bonding shelf and a non-conductive surface (22) placed above the bonding shelf. The non-conductive surface has a plurality of areas exposing portions (21) of the plurality of conductive runners allowing an elastomer connector (24) to couple the exposed portions of the plurality of conductive runners to a corresponding plurality of conductive areas (29) on the substrate.

16 Claims, 5 Drawing Sheets

(12)  United States Patent 6,162,064

METHOD AND APPARATUS FOR ELASTOMER CONNECTION BETWEEN A BONDING SHELF AND A SUBSTRATE

FIELD OF THE INVENTION

This invention relates in general to elastomer connections between a bonding shelf and a substrate and more particularly to a connection between a bonding shelf of a liquid crystal display and a substrate.

BACKGROUND OF THE INVENTION

Adequately making electrical connections between conductive runners on a bonding shelf of a liquid crystal display (LCD) and the conductive pads on a printed circuit board (PCB) in a high volume manufacturing process typically requires consideration of the pitch of the runners on the bonding shelf, the pitch of the conductive pads on the PCB, the means of attachment between the PCB and LCD and alignment of the runners and pads. In the past when the pitch of the runners and pads were large enough, elastomer conductors could be used to electronically connect the LCD to the PCB. The alignment requirements of LCD runners with smaller pitches (now found below 12 mil pitch) have made the use of elastomer connectors impractical. Thus, only an Heat Seal Connector (HSC) or a Tape Automating Bonding (TAB) type connection could be used with existing methods to satisfy the alignment requirements in an LCD to PCB connection. FIG. 1 illustrates an example of an HSC connection for a PCB and LCD assembly 9 consisting of a LCD panel 2 having conductive runners 3, a flex circuit 4 having conductive runners 5 and a PCB 6 having corresponding conductive runners 7 and connector pads 1. The use of elastomer connectors in this instance could be quite useful, particularly in front mount display products such as pagers, but the small pitch (and high pin count) would cause alignment problems as previously stated. Thus, a need exists for a method, arrangement or apparatus that allows for an elastomer connection between conductive runners on a bonding shelf and conductive pads or runners on a printed circuit board or substrate.

SUMMARY OF THE INVENTION

In a first aspect of the present invention, an elastomer connection between a bonding shelf and a substrate comprises a plurality of conductive runners on a surface of the bonding shelf with a non-conductive surface placed above the bonding shelf, the non-conductive surface having a plurality of areas exposing portions of the plurality of conductive runners and an elastomer connector which couples the exposed portions of the plurality of conductive runners to a corresponding plurality of conductive areas on the substrate.

In another aspect of the present invention, a liquid crystal display (LCD) having a bonding shelf allowing for a greater tolerance for alignment to a plurality of pads on a substrate comprises a plurality of runners placed on the bonding shelf of the LCD and a non-conductive surface placed above the bonding shelf, the non-conductive surface having a plurality of areas exposing portions of the plurality of conductive runners which allows an elastomer connector to couple to the exposed portions of the plurality of conductive runners to a corresponding plurality of conductive areas on the substrate when the elastomer connector is under compression.

In yet another aspect of the present invention, a selective call device having a liquid crystal display (LCD) having a bonding shelf allowing for a greater tolerance for alignment to a plurality of pads on a substrate comprises a selective call device having the LCD described above.

In another aspect of the present invention, a method for making an elastomer connection between a bonding shelf and a substrate comprises the steps of providing a liquid crystal display (LCD) having a bonding shelf and a plurality of conductive runners on the bonding shelf of the LCD. Then, the method comprises the step of applying a non-conductive surface on a portion of the plurality of conductive runners, wherein only a portion of the plurality of the conductive runners remain exposed.

DETAILED DESCRIPTION

Figure 1:
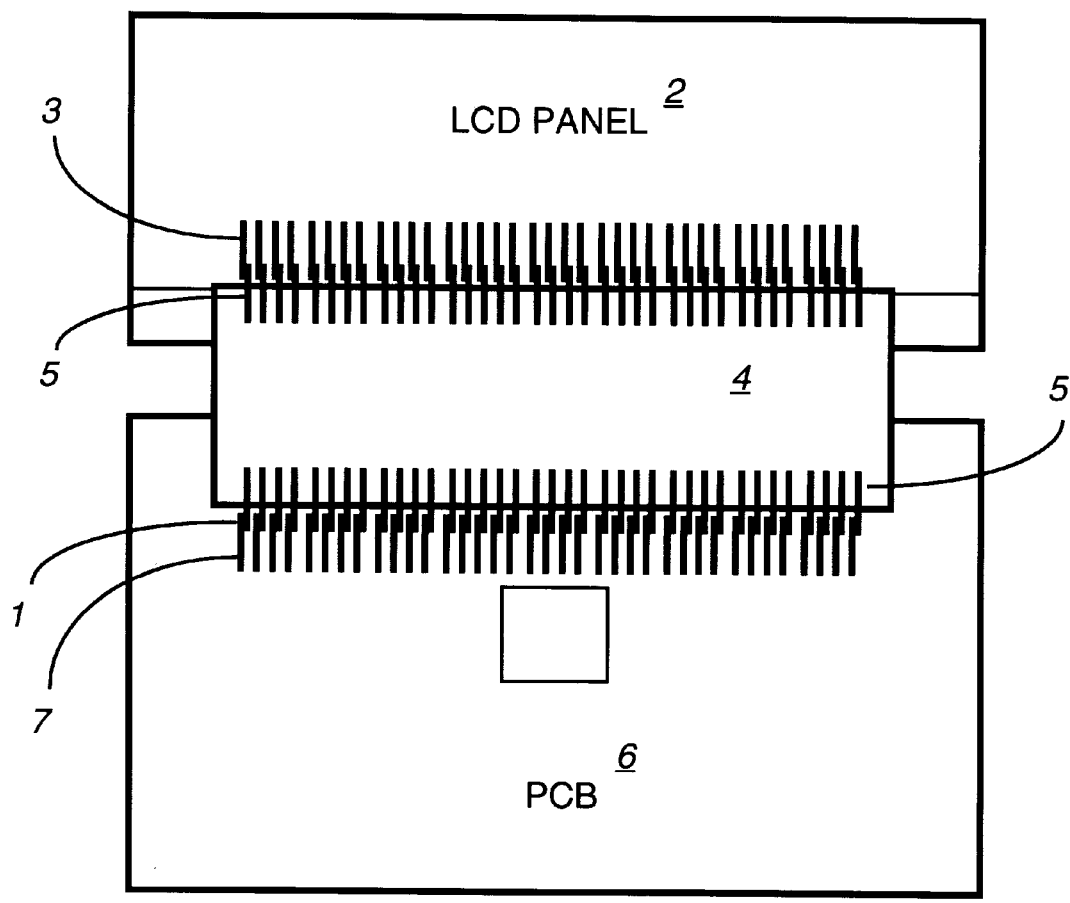
FIG. 1 is electrical block diagram showing an existing connection method between a liquid crystal display panel and a printed circuit board.
Figure 2:
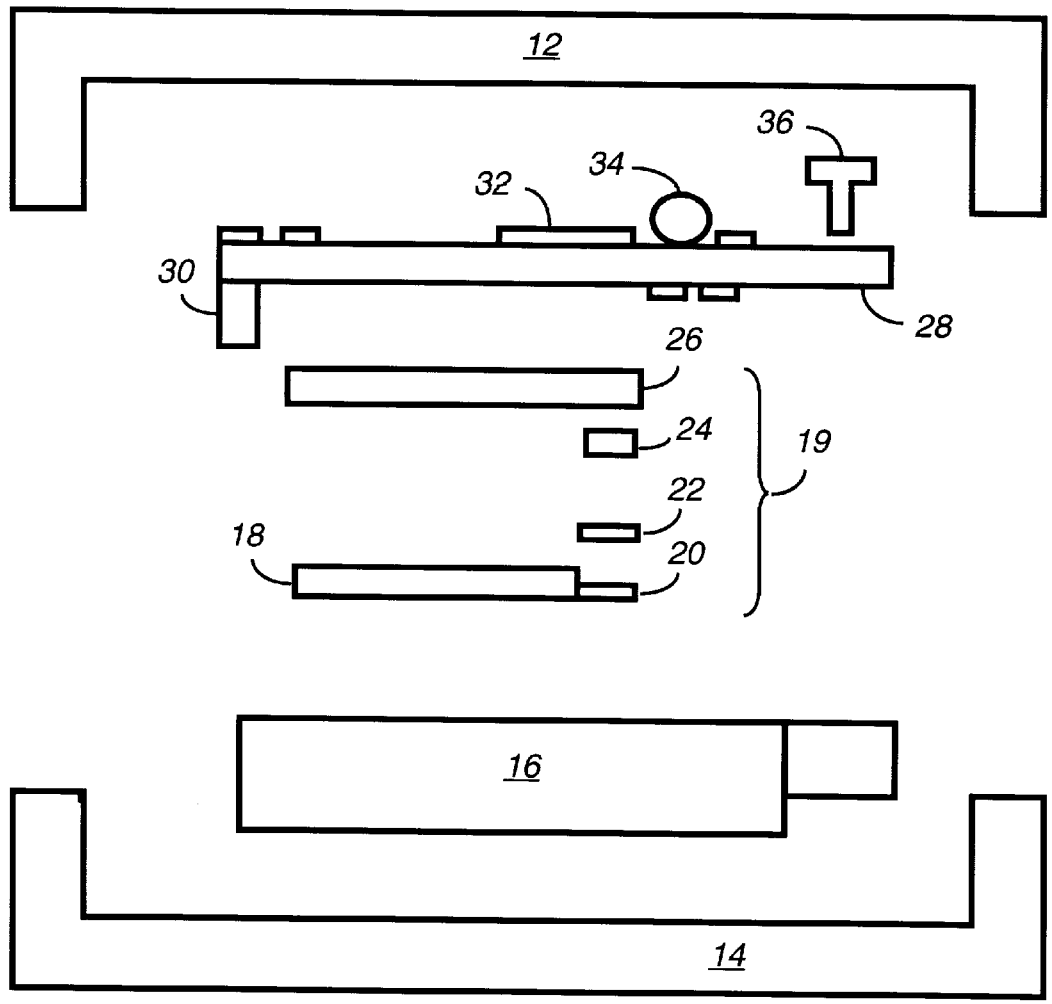
FIG. 2 is an exploded view of a selective call device in accordance with the present invention.

Referring to FIG. 2, a selective call device 10 such as a selective call receiver or transceiver is shown in accordance with the present invention. In particular, the selective call device 10 preferably comprises a liquid crystal display assembly having a liquid crystal display (LCD) 18 having a bonding shelf 20 with a plurality of runners and a non-conductive surface 22 such as mylar film or mylar thin film (or any applied non-conductive coating) placed above the bonding shelf, the non-conductive surface having a plurality of areas exposing portions of the plurality of conductive runners which allows an elastomer connector 24 to couple to the exposed portions of the plurality of conductive runners to a corresponding plurality of conductive areas on a substrate (such as printed circuit board (PCB) 28) when the elastomer connector is under compression. If mylar film is used, the film preferably includes apertures that form the areas where the portions of the plurality of conductive runners are exposed. Whether mylar film or an applied coating is used, the pattern applied should leave portion of the plurality of conductive runners on the LCD exposed. Preferably, the PCB has a corresponding plurality of conductive areas on the substrate that couples to the exposed portions of the plurality of conductive runners as well as portions of the non-conductive surface. Although not yet evident, this assembly allows for a greater tolerance for alignment to a plurality of pads on the substrate.

Additionally, the selective call device 10 may also include a lightwedge 26 placed between the PCB 28 and the LCD 18 to provide added protection to the LCD. Preferably the assembly 19 is all housed within mating external housing portions 12 and 14. An antenna 30, a motor 34, and other circuitry 32 (such as decoders and microprocessors as is well known in the art) are mounted on the PCB 28. The selective call device 10 may also include an internal gut or frame 16 to provide additional stability to the components within the selective call device. The different portions of the device 10 can be mounted together using a screw 36 or other well known fastening means.

Figure 3:
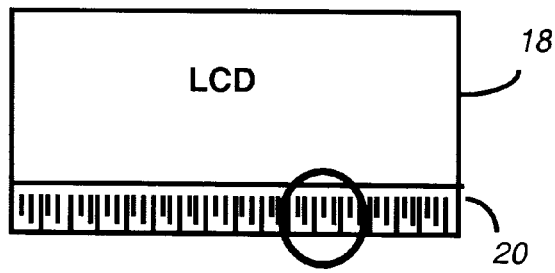
FIG. 3 is a top plan view of a liquid crystal display having a bonding shelf in accordance with the present invention.
Figure 5:
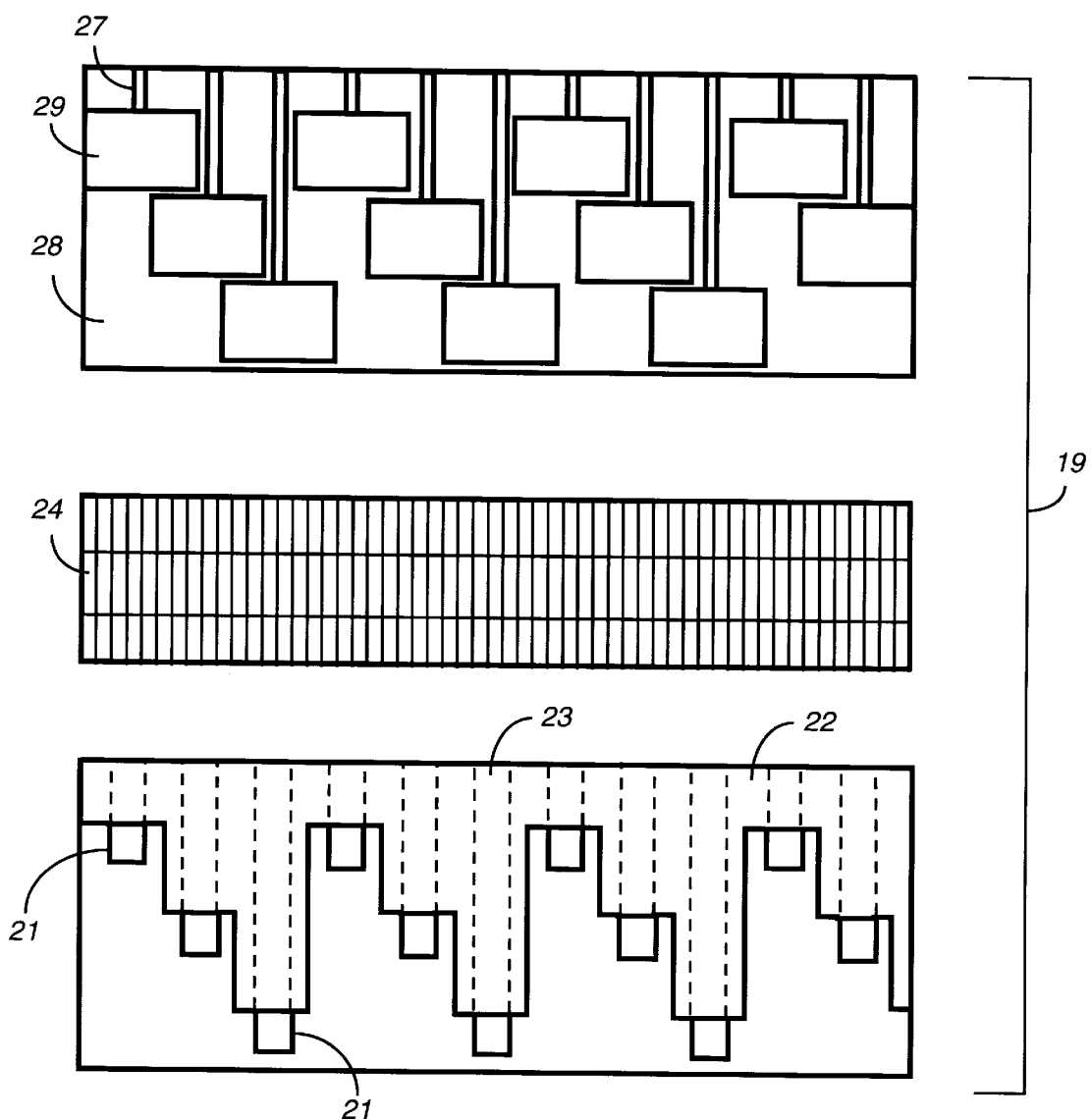
FIG. 5 is a diagram illustrating a printed circuit board, elastomer connector and bonding shelf in accordance with the present invention.

Referring to FIGS. 3 and 5, an LCD 18 is shown in accordance with the present invention. The LCD preferably has a bonding shelf 20 allowing for a greater tolerance for alignment to a plurality of pads on a corresponding substrate or PCB. The LCD preferably comprises a plurality of runners 23 placed on the bonding shelf of the LCD and a non-conductive surface 22 placed above the bonding shelf, the non-conductive surface having a plurality of areas exposing portions 21 of the plurality of conductive runners which allows an elastomer connector 24 to couple to the exposed portions (21) of the plurality of conductive runners to a corresponding plurality of conductive areas 29 on the substrate 28 when the elastomer connector is under compression. The non-conductive surface can be constructed or applied on to the bonding shelf to form a plurality of areas exposing portions of the plurality of conductive runners in a staggered formation. Note that the conductive runners do not need to be in a staggered formation and can take on many different patterns while still remaining within the scope and spirit of the present invention. The non-conductive surface with the exposed areas effectively increases the pitch of the conductive runners of the LCD bonding shelf by 3 times in the case of a repeating 3 hole pattern or even 4 times in the case of a repeating 4 hole pattern. The elastomer connector "fills" into the hole and then passes current to the pads on the PCB without shorting an adjacent pad. Even though the elastomer connector rides on top of adjacent conductive runners, the non-conductive surface (like mylar) effectively provides greater tolerance in preventing shorts between the adjacent conductive runners and allows for much greater tolerance for alignment to the PCB. A slight misalignment will not short the adjacent runner because of the non-conductive surface.

Figure 4:
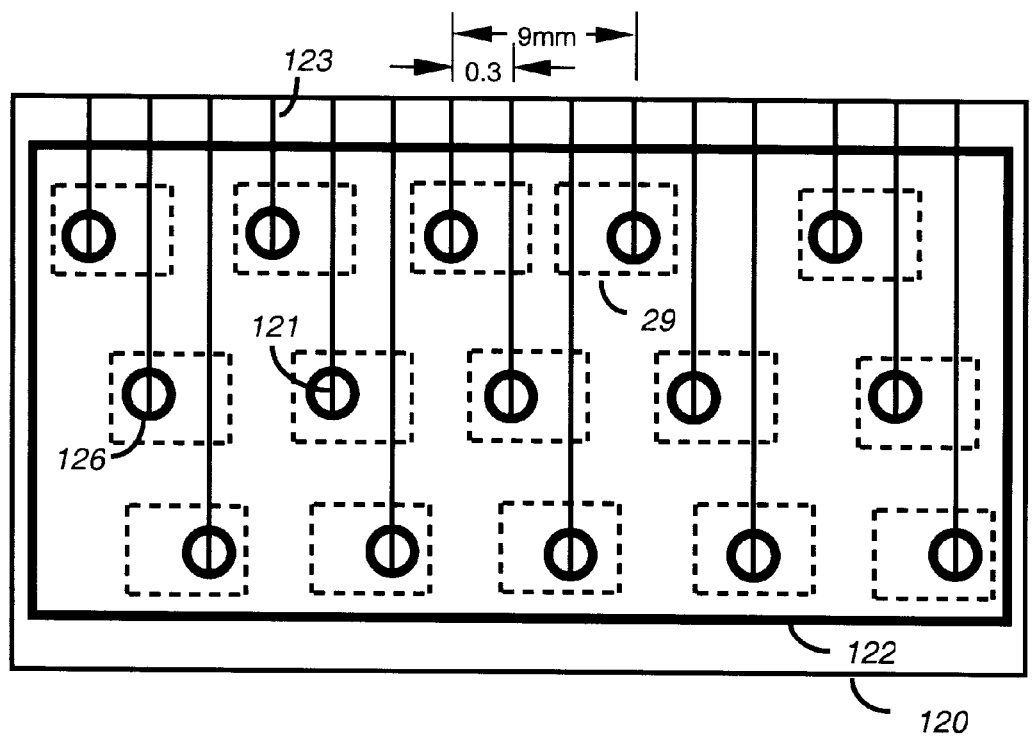
FIG. 4 is a top plan view of a bonding shelf in accordance with the present invention.

Referring to FIG. 4, a liquid crystal display 100 having an alternatively patterned non-conductive surface 122 above a bonding shelf 120 is shown. As with the previous example, the bonding shelf 120 has a plurality of conductive runners 123 formed in a staggered pattern. The non-conductive surface 122 likewise has a plurality of apertures 126 or holes in a staggered pattern that leaves a portion 121 of the conductive runners exposed when the non-conductive surface 122 is placed or applied on top of the bonding shelf as shown. In FIG. 4, a footprint of the plurality of conductive area 29 of the printed circuit board 28 (see FIG. 5) is also shown to illustrate that even though the pads may cover two adjacent conductive runners (123), shorts between them are prevented because of the non-conductive surface 122 and its staggered pattern of apertures 126. Note in this example, that even though the pitch between conductive runners is 0.3 millimeter (mm) the effective pitch becomes 0.9 mm providing for a much greater alignment tolerance to the pads of the PCB.

Referring to FIG. 5, the present invention in essence can comprise an elastomer connection between a bonding shelf 20 and a substrate 28, wherein the connection comprises a plurality of conductive runners 23 on a surface of the bonding shelf and a non-conductive surface 22 placed above the bonding shelf, the non-conductive surface having a plurality of areas 21 exposing portions of the plurality of conductive runners. Preferably an elastomer connector 24 couples the exposed portions of the plurality of conductive runners to a corresponding plurality of conductive areas 29 on the substrate. The bonding shelf of an LCD is a glass surface having the plurality of conductive runners formed from indium tin oxide which is etched away. Of course, bonding shelves and conductive runners formed of other materials and processes are contemplated within the scope and spirit of the present invention.

Figure 6:
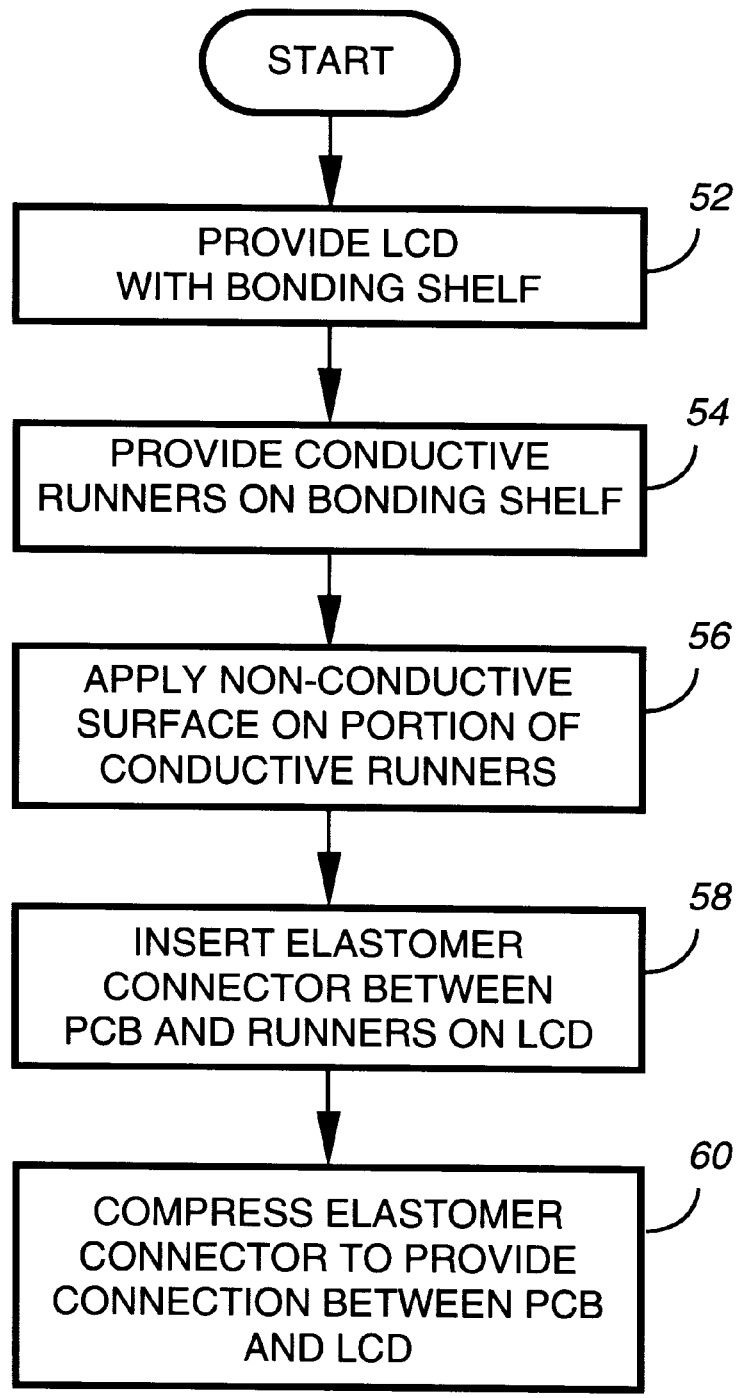
FIG. 6 is a flow chart illustrating a method for elastomer connection between a bonding shelf and a substrate in accordance with the present invention.

Referring to FIG. 6, a flow chart 50 illustrating a method for making an elastomer connection between a bonding shelf and a substrate is shown. Preferably the method comprises the steps of providing a liquid crystal display (LCD) having a bonding shelf at step 52 and providing a plurality of conductive runners on the bonding shelf of the LCD at step 54. Then, the method is completed by applying a non-conductive surface on a portion of the plurality of conductive runners at step 56, wherein only a portion of the plurality of the conductive runners remain exposed. Additionally, the method further comprises the step 58 of providing an elastomer connector and the step 60 of compressing the elastomer connector to provide for the coupling between the portion of the plurality of conductive runners that remain exposed to a corresponding plurality of conductive areas on printed circuit board. Preferably, the corresponding plurality of conductive areas on the PCB are oversized in relation to the pitch or size of the conductive runners on the LCD.

It should be understood that the disclosed embodiments are merely examples and the invention is not restricted thereto. It will be understood by those skilled in the art that variations and modifications can be made within the scope and spirit of the present invention as defined by the appended claims.

What is claimed is:

1. An elastomeric connector connection between a bonding shelf and a substrate, comprising:

a plurality of conductive runners on a surface of the bonding shelf;

a non-conductive surface placed above the bonding shelf, the non-conductive surface having a plurality of areas that form exposed portions of the plurality of conductive runners; and an elastomeric connector which couples the exposed portions of the plurality of conductive runners to a corresponding plurality of conductive areas on the substrate wherein the non-conductive surface is a non-conductive coating applied to the bonding shelf and the plurality of conductive runners, wherein the non-conductive coating is applied to leave portions of the plurality of conductive runners exposed in a staggered formation.

2. The elastomeric connector connection of claim 1, wherein the bonding shelf is a portion of a liquid crystal display.

3. The elastomeric connector connection of claim 2, wherein the bonding shelf is a glass surface having the plurality of conductive runners formed from indium tin oxide which is etched away.

4. The elastomeric connector connection of claim 1, wherein the non-conductive surface is a mylar thin film with apertures allowing for the exposure of a portion of the plurality of conductive runners.

5. The elastomeric connector connection of claim 1, wherein the substrate is a printed circuit board.

6. A liquid crystal display (LCD) having a bonding shelf allowing for a greater tolerance for alignment to a plurality of pads on a substrate, comprising:

a plurality of conductive runners placed on the bonding shelf of the LCD; and a non-conductive surface placed above the bonding shelf, the non-conductive surface having a plurality of areas that form exposed portions of the plurality of conductive runners in a staggered fashion which allows an elastomeric connector to couple to the exposed portions of the plurality of conductive runners to a corresponding plurality of conductive areas on the substrate when the elastomeric connector is under compression.

7. The LCD of claim 6, wherein the non-conductive surface is a mylar thin film with apertures allowing for the exposure of a portion of the plurality of conductive runners.

8. The LCD of claim 6, wherein the non-conductive surface is a non-conductive coating applied to the bonding shelf and the plurality of conductive runners, wherein the non-conductive coating is applied to leave portions of the plurality of conductive runners exposed.

9. The LCD of claim 6, wherein the substrate is a printed circuit board.

10. A selective call device having a liquid crystal display (LCD) having a bonding shelf allowing for a greater tolerance for alignment to a plurality of pads on a substrate, the LCD comprising:

a plurality of conductive runners placed on the bonding shelf of the LCD; and a non-conductive surface placed above the bonding shelf, the non-conductive surface having a plurality of areas that form exposed portions of the plurality of conductive runners in a staggered fashion which allows an elastomeric connector to couple to the exposed portions of the plurality of conductive runners to a corresponding plurality of conductive areas on the substrate when the elastomeric connector is under compression.

11. The LCD of claim 10, wherein the non-conductive surface is a mylar thin film with apertures allowing for the exposure of a portion of the plurality of conductive runners.

12. The LCD of claim 10, wherein the non-conductive surface is a non-conductive coating applied to the bonding shelf and the plurality of conductive runners, wherein the non-conductive coating is applied to leave portions of the plurality of conductive runners exposed.

13. The LCD of claim 10, wherein the substrate is a printed circuit board that has the corresponding plurality of conductive areas on the substrate that couples to exposed portions of the plurality of conductive runners as well as portions of the non-conductive surface.

14. A method for making an elastomeric connector connection between a bonding shelf and a substrate, comprising the steps of:

providing a liquid crystal display (LCD) having a bonding shelf;

providing a plurality of conductive runners on the bonding shelf of the LCD; and applying a non-conductive surface on a portion of the plurality of conductive runners, wherein only a portion of the plurality of conductive runners remain exposed in a staggered fashion.

15. The method of claim 14, wherein the method further comprises the step of providing an elastomeric connector for coupling the portion of the plurality of conductive runners that remain exposed to a corresponding plurality of oversized conductive areas on a printed circuit board when the elastomeric connector is under compression.

16. The method of claim 15, wherein the method further comprises the step of compressing the elastomeric connector between the bonding shelf and the printed circuit board to provide a connection between the plurality of conductive runners that are exposed and the corresponding plurality of oversized conductive areas on the printed circuit board.

* * * * *